United States Patent
Chang et al.

(10) Patent No.: US 6,602,766 B2
(45) Date of Patent: Aug. 5, 2003

(54) ULTRAVIOLET/ELECTRON BEAM FORMING PROCESS FOR MULTI-LAYER ELECTRONIC COMPONENTS AND PRODUCTS THEREOF

(75) Inventors: Daniel H. Chang, San Diego, CA (US); Xiang-Ming Li, San Diego, CA (US)

(73) Assignee: AEM, Inc., San Diego, CA (US)

(*) Notice: Subject to any disclaimer, the term of this patent is extended or adjusted under 35 U.S.C. 154(b) by 0 days.

(21) Appl. No.: 09/996,469

(22) Filed: Nov. 27, 2001

(65) Prior Publication Data

US 2002/0072205 A1 Jun. 13, 2002

Related U.S. Application Data

(60) Provisional application No. 60/254,086, filed on Dec. 7, 2000.

(51) Int. Cl.$^7$ ................................................ H01L 21/20
(52) U.S. Cl. ...................................... 438/496; 430/198
(58) Field of Search ......................... 438/325, 496; 428/328, 323, 325

(56) References Cited

U.S. PATENT DOCUMENTS

| | | | | |
|---|---|---|---|---|
| 3,989,644 A | * | 11/1976 | Bolon et al. | 252/514 |
| RE31,411 E | * | 10/1983 | Bolon et al. | 252/501.1 |
| 4,794,042 A | * | 12/1988 | Kubota et al. | 428/328 |
| 4,828,961 A | * | 5/1989 | Lau et al. | 430/198 |
| 4,965,294 A | * | 10/1990 | Ohngemach et al. | 522/79 |
| 5,697,043 A | * | 12/1997 | Baskaran | 264/621 |
| 6,325,610 B2 | * | 12/2001 | Chiu et al. | 425/150 |
| 6,352,763 B1 | * | 3/2002 | Dillon et al. | 428/325 |
| 6,376,148 B1 | * | 4/2002 | Liu | 430/124 |

* cited by examiner

Primary Examiner—David Nelms
Assistant Examiner—Thao Le
(74) Attorney, Agent, or Firm—Liu & Liu

(57) ABSTRACT

A multilayered electronic component with or without interlayer connections created by a process using radiation curing such as ultraviolet/electron beam curing techniques. UV light or electron beam curable binders are mixed with ceramic powders and metals powders to form a ceramic slurry and electrode ink, there is little or no solvent in the metal ink and ceramic slurry. Instead of drying, a UV or electron beam is used for curing the binders. These binders could contain UV/electron beam curable monomers or oligomers, photo initiators, and other additives to provide the desired chemical and physical properties in the forming process.

24 Claims, 2 Drawing Sheets

ULTRAVIOLET/ELECTRON BEAM FORMING PROCESS FOR MULTI-LAYER ELECTRONIC COMPONENTS AND PRODUCTS THEREOF

This application claims the benefit of Provisional Application No. 60/254,086, filed Dec. 7, 2000.

BACKGROUND OF THE INVENTION

1. Field of the Invention

The present invention relates generally to a process of manufacturing multi-layer electronic components with electrodes embedded in ceramics, and in particular a process for building multiple layers of ceramics and electrodes using radiation curing techniques to manufacture multi-layer electronic components and products thereof.

2. Description of Related Art

A multi-layer electronic component often contains both conductive and non-conductive layers. It is sometimes required to form inter-layer electrical connections between the conductive layers to produce electronic components with the desired electrical characteristics. There are a few existing processes for manufacturing multi-layer electronic components.

First, there is the dry sheet process (e.g., U.S. Pat. No. 5,032,815). Dry sheets of ceramic green tapes with electrodes printed thereon are used as the basic parts of the electronic components. These ceramic tapes and electrode materials are made of ceramic and metal powder respectively bound together by polymer binders. These dry sheets are laminated at elevated temperatures and high pressure. To allow inter-layer connections, holes are punched on the ceramic tape and filling of metal powder ink in those holes are necessary to form vias. After the structure is formed, a burnout process is required to remove/decompose the binder and a firing process is required to sinter the ceramic powder and metal powder to provide the desired physical and electrical properties. This process involves many steps and many pieces of major equipment (tape casting, tape cutting, via punching, electrode printing, tape peeling, tape stacking, and lamination) to complete the buildup for the component.

For the dry sheet process, sheets and electrodes are dry, thus interlayer solvent interaction will not likely occur during lamination. However, since the location with electrodes is normally thicker than the location without electrodes, higher pressure lamination could cause material creeping. Problems with de-lamination or short circuit for thin layers may occur.

The second process is a semi-wet process (e.g., U.S. Pat. No. 4,322,698). Dry sheets are made for the top and bottom ceramic layers, but a wet process is used to print electrodes and ceramic layers in between. This process involves many process steps and many pieces of major equipment (tape casting, tape cutting, tape peeling, tape pressing, printing for both ceramic and electrode active layers, drying, tape stacking, and tape lamination) to complete the buildup. Solvents are also used in dissolving or dispersing organic binders for binding ceramics and metal powder together to form the desired structure. Drying is required to remove the solvent and solidify the ceramic slurry and metal ink. It consumes a substantial amount of time and heat energy, and is normally not friendly to the environment.

Finally, another existing process is the wet process (e.g., U.S. Pat. No. 5,650,199). A curtain coater or similar devices are used to lay down ceramic coatings in slurry form on pallets or bars to build multilayer ceramic components. Each layer of coating sticks to those above and below it without the need for lamination, which is required in both the dry sheet and semi-wet process. When using a wet buildup process for making an interlayer connection, a dot, made of a metal ink, is printed on top of the electrode, which has been printed on top of a ceramic layer that rests on a pallet, at the location where a connection to the upper adjacent electrode is desired. A thin layer of ceramic slurry coating is then applied on the top of the pallet by using a curtain coater. Due to the chemical-physical incompatibility of the dot ink and ceramic slurry, vias or holes, which are occupied by the dot ink, are formed on the ceramic coating layer.

The wet process requires at least two major steps (coating and printing) and at least three pieces of major equipment (coating, drying, and printing) to complete the buildup process. Compared to the dry sheet and semi-wet processes, the wet process significantly reduces the process steps and labor costs. However, because the layers are generally wet when they are stacked against each other, there is an interaction between the solvents in different layers exists, which can cause an undesirable effect on the electrical performance of the device, hence reducing the yield of the production. Since the curtain coating follows the contour of the prints, it is difficult to obtain flat and even surface. The uneven surface could further affect subsequent printing and via forming.

It is desirable to provide an improved process for forming multi-layer electronic components which overcomes the drawbacks in the prior art.

SUMMARY OF THE INVENTION

The present invention overcomes the drawbacks of the prior art by minimizing the use of solvents in the metal ink and ceramics slurry. The binders used are of the type that cures (e.g., by polymerization) by applying radiation, such as UV or electron beam (hereinafter "E beam"). According to one embodiment of the present invention, UV light or E beam curable binders are mixed with ceramic powders and metals powders to form ceramic slurry and electrode ink, obviating the need for solvent in the metal ink and ceramic slurry. Instead of drying, a UV or electron beam is used for solidifying the binders. These binders could contain UV/electron beam curable monomers or oligomers, photo initiators, and other additives to provide the desired chemical and physical properties in the forming process. Fewer steps are needed in this process, thereby saving cost and enhancing quality. This process is also more friendly to the environment.

DETAILED DESCRIPITION OF THE PREFERRED EMBODIMENT

This invention is described in a preferred embodiment in the following description with references to the attached drawings. While this invention is described in terms of the best mode of achieving this invention's objectives, it will be appreciated by those skilled in the art that variation may be accomplished in view of these teachings without deviating from the spirit or scope of the invention.

Figure 1:
FIG. 1 illustrates a layer of ceramic slurry deposited on a substrate.
Figure 2:
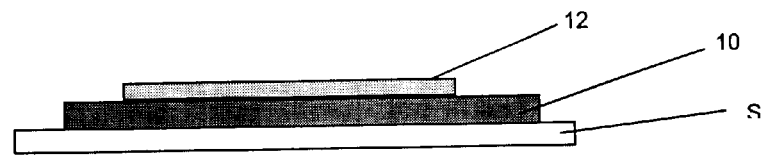
FIG. 2 illustrates an electrode printed on the first ceramic layer created by the ceramic slurry of FIG. 1.
Figure 3:
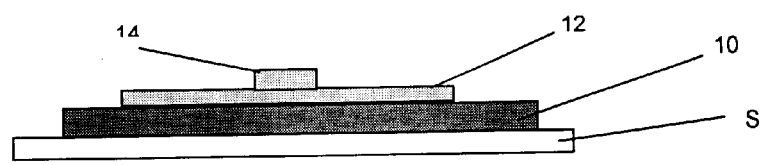
FIG. 3 illustrates the first ceramic layer created by the ceramic slurry of FIG. 1 and electrode of FIG. 2 with a printed dot with conductive ink for interlayer electrical connection.

In one embodiment of this invention, as illustrated in FIG. 1, a first electrically non-conductive layer 10 comprising a slurry of ceramic material, made of radiation curable binders such as UV/E beam curable binders and ceramic powder, is deposited on a substrate S through a slot die or a doctor blade, or a printing apparatus. The binders may include solvents, but preferably no solvents or an insignificant trace amount of solvents. This layer 10 is then subject to radiation curing (e.g., by polymerization) such as UV/E beam curing and becomes solid. Then, as illustrated in FIG. 2, a conductive ink, made of radiation curable binders such as UV/E beam curable binders and metal powder, can be printed onto the ceramic layer 10 to form a first electrode 12. This printed pattern is then subject to radiation curing such as UV/E beam curing and becomes solid. When substantial solventless binders are used, there is substantially no drying or solvent removal required in the forming process, and there is minimal shrinkage of the first electrode 12 and the first ceramic layer 10 during forming. Further, the coating is very smooth after solidification. If necessary, as illustrated in FIG. 3, at the location where the interlayer electrical connection is to be made, conductive ink made of metal powder (e.g., silver, gold, platinum, copper) in radiation curable binders, such as UV/E beam curable binders, is printed as a conducting dot 14 on top of the electrode that needs the connection. The dot 14 may be formed using the same type of binder materials as that used to form the electrode 12. The printed conducting dot 14 is cured by radiation, such as UV/E beams and solidifies.

Figure 4:
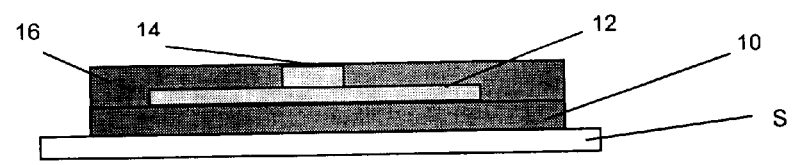
FIG. 4 illustrates the combination of FIG. 3 with a new layer of ceramic slurry.
Figure 5:
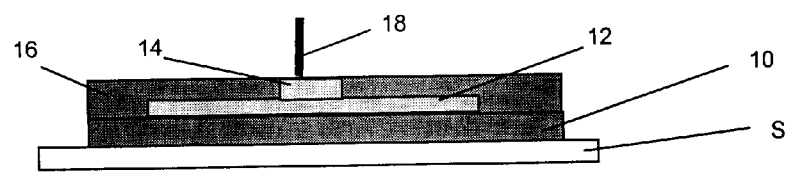
FIG. 5 illustrates a flexible blade used to clean the top of the printed conducting dot.

Then, as illustrated in FIG. 4, a second layer 16 of ceramic slurry, also made of radiation curable binders such as UV/E beam curable binders, is coated on top of the conducting dot 14. The ceramic slurry 16 may be of the same composition as the slurry layer 10. Since the cured conducting dot 14 for connection is solid with high mechanical strength, subsequent ceramic slurry coating processes will not smear the dot 14, such as when the edge of a doctor blade 18 or slot die scrapes the top 20 of the dot 14 as shown on FIG. 5. The flexible blade 18 smoothes the surface of the slurry layer 16 and the dot 14 and cleans the top 20 of the dot 14, as shown in FIG. 5. The ceramic slurry layer 16 is subsequently cured by radiation such as UV/E beam. Since there is substantially no solvent removal during curing, there is substantially no shrinkage in the ceramic layer 16 after solidification. A flat surface is formed in alignment with the top 20 of the dot 14. The top 20 of the dot 14 can be cleaned to remove any traces of thin ceramic coating from the previous step.

Figure 6:
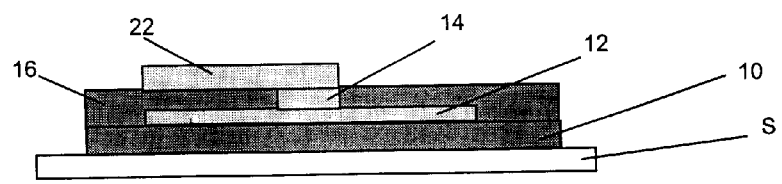
FIG. 6 illustrates an interlayer connection between two electrodes.

On the top 20 of the dot 14, metal ink made of conductive powder in radiation curable binders, such as UV/E beam curable binders, can be printed as the second electrode 22 and cured. In such a way, an interlayer connection of two electrodes 12 and 22 on the top and the bottom, respectively, of the ceramic layer 16 is made via the dot 14, as illustrated in FIG. 6. The connection can be strengthened by metal diffusion during a subsequent firing or sintering process.

It is noted that for each layer described above, it may or may not cover the entire layer below. For example, the electrode layer may cover the underlying ceramic layer in a pattern that does not fully cover the ceramic layer, in the form of narrow electrical traces. The dot covers only a small area where the via is to be formed.

Figure 7:
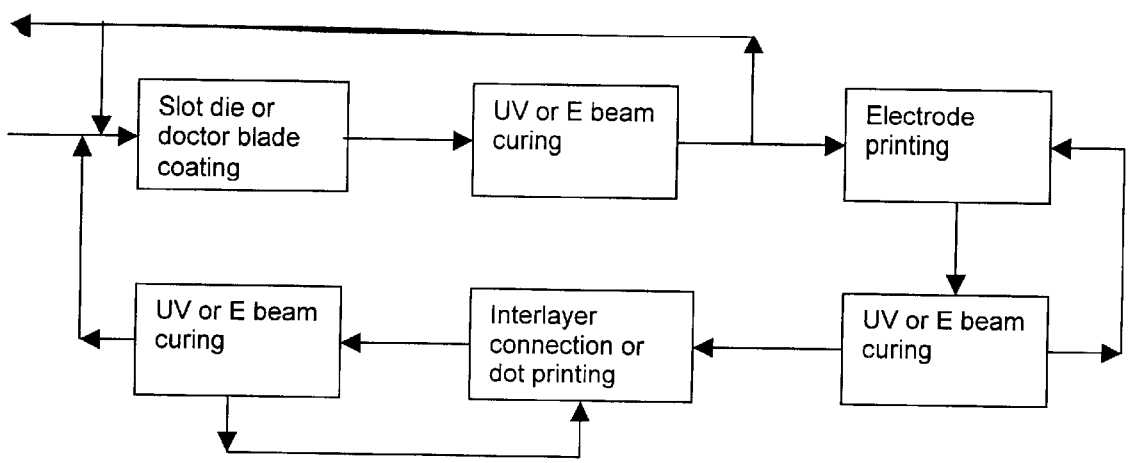
FIG. 7 illustrates the process flow of the UV/E beam forming process.

Referring to FIG. 7, the basic process steps described above may be repeated in several iterations to form multiple interconnecting electrodes and ceramic layers.

The UV/E beam curing processes take just a few seconds, compared to the much longer time (a few minutes) needed to dry a solvent based layer in the wet or semi-wet processes of the prior art. Therefore, the production cycle is shorter for the present UV/E forming process. Further, the top or bottom covers can be formed in one coating. The UV/E beam curing processes is simple and low cost. The energy consumption for curing is about one tenth of what is required for drying process. Since no solvent is used, there is no VOC emission from the UV/E beam forming process, thus the UV/E beam curing process is more friendly to the environment. Also, the product quality produced by the UV/E beam curing process is improved because of reduction on shrinkage. Moreover, since the individual layers have already hardened after the UV/E beam curing process, the undesirable interaction between layers is kept to a minimum. Furthermore, slot die coating and blade scrapping make a smooth surface, which results in good adhesion between layers. Electrode patterns could be refined with a UV lithographic process to surpass the limit associated with screen printing.

The UV/E beam curable binders could contain UV/E beam curable monomers or oligomers, photo initiators, and other additives to provide the desired chemical and physical properties in the forming process. Experiments have been conducted to determine the appropriate composition of the UV curable binder for making multi-layer ceramic components, including ceramic slurry and the metal powder ink. In the ceramic slurries, the total percentage of UV/E beam curable binders can be in the range of about 5% to 60% by weight of total. In the metal conductive ink formulations, the UV/E beam curable binders can be in the range of about 3% to 40% by weight of total. In a preferred embodiment of the invention, the composition of a UV/E beam curable ceramic slurry (by weight) is as follows: ceramic powder (74.07%), polyester acrylate oligomer (2.59%), modified polyetherpolyol acrylate (2.59%), monofunctional urethane acrylate (9.85%), acrylic acid ester (9.33%), flow modifier (1.04%), photo initiator (0.52%). The composition of a UV beam curable ink (by weight) is as follows: silver powder (80.0%), polyester acrylate (19.2%), photo initiator (0.8%; if UV curable binder). The wavelength of the UV for curing the above binders are in the range of about 300 to 450 nm. The wavelength is dictated by the photo initiators selected and the adsorption spectrum of the materials. Preferably, several photo initiators may be used to cover a wider range of suitable radiation wavelengths. Substantially similar formulations without photo initiators can be used for E beam curing to deal with thicker coating and materials with a high absorption rate of UV light. The energy level can be in the range of about 100 keV to 300 keV, and doses of 5 to 20 Mrad.

It can be appreciated that the invented UV/E beam curing method for manufacturing multi-layer products with or without interlayer electrical connections can be performed by using UV curable binders, ceramic slurry, and inks of different compositions. At least one of the radiation cured layers (or a portion thereof) remains a part of the finished electronic component. Since the process involves substantially no solvent removal and virtually no (or very little) shrinkage, the coating surface of ceramic can be very smooth even though electrodes are embedded within the layer. It has been shown that very thin coatings, up to 3–5 microns thick, can be made using this UV/E beam curing method. Finally, the major pieces of equipment required for the set-up of a production line using this UV/E beam curing method include slot die or doctor blade, coating mechanisms, blade scrapper, screen or stencil printers, and UV/E beam curing stations.

The process of the present invention may be implemented to form different types of electronic components, for use either standing alone, or integrated or combined with other passive and/or active components to form larger components, including but not limited to electrical devices, electronic devices, solid state devices, semi-conductor device, opto-electonic devices (such as LCD displays), etc. It is understood that the present invention may be implemented to process many different types of devices without departing from the scope and spirit of the present invention.

While the present invention has been described with respect to the preferred embodiments for achieving this invention's objectives, it will be apparent to those in the skilled art that various modifications and improvements may be made without departing from the scope and spirit of the invention. For example, radiation curing other than UV/E beam may be implemented using complementary radiation curable binders. Also, while the layers deposited on the substrate are described above in accordance with specific embodiments, the described layers may be interchanged or different. For example, the electrode layer may be the first layer formed on the substrate. While the disclosed embodiment showed a layer of radiation curable binder immediately above the substrate, it is understood that the deposition of layer or layers "on" or "above" the substrate could involve intermediate layer or layers between the substrate and the first layer formed by curing a layer that comprises a material in a radiation curable binder. Similarly, the deposition of other layer or layers "on" or "above" a layer could include intermediate layers as well. Further, the ceramic slurries and/or inks made of radiation curable binder systems can be used alone or in combination of other slurries, inks or other layers of materials, which may or may not involve radiation curable materials, or dry, wet, semi-wet or other processes involving drying or curing of the layer materials. Accordingly, the disclosed embodiments are to be considered merely as illustrative of the invention.

What is claimed is:

1. A process of forming a multi-layer electronic component on a substrate, comprising the steps of:
   depositing over the substrate a first layer that comprises a first material in a first radiation curable binder;
   exposing the first layer to radiation to cure the first radiation curable binder to form a solid layer that remains a portion of the electronic component;
   depositing a second layer that comprises a second material in a second radiation curable binder over the first layer; and
   exposing the second layer to radiation to cure said second radiation binder.

2. The process of claim 1, wherein the first radiation curable binder includes a binder material having a characteristic that it cures when subject to at least one of UV radiation and electron beam radiation.

3. The process of claim 1, wherein the binder material comprises at least one radiation curable monomer or oligomer.

4. The process of claim 3, wherein the binder material further comprises a photo initiator.

5. The process of claim 1, wherein the first or second material comprises at least one of:
   (a) ceramic powder; and
   (b) electrically conductive powder.

6. The process of claim 5, wherein the first or second layer comprises a pattern of electrodes.

7. The process of claim 1, wherein the first or second layer is deposited in a slurry form.

8. The process of claim 7, wherein the slurry comprises a ceramic slurry, which comprises about 40% to 95% of ceramic powder; and about 5% to 60% of a radiation curable binder system.

9. The process of claim 8, wherein the radiation curable binder system comprises polyester acrylate oligomer; modified polyetherpolyol acrylate; monofunctional urethane acrylate; acrylic acid ester; flow modifier; and a photo initiator if the radiation curable binder is curable by light radiation such as UV.

10. The process of claim 7, wherein the slurry comprises a conductive ink, which comprises about 50% to 95% metal powders; and about 5% to 50% of a radiation curable binder system.

11. The process of claim 10, wherein the radiation curable binder comprises polyester acrylates, epoxy acrylates, urethane acrylates, and a photo initiator if the radiation curable binder is curable by light radiation such as UV.

12. The process of claim 1, further comprising the steps of:
   depositing over the second layer additional layer or layers of materials in a radiation curable binder; and
   exposing said layer or layers of materials to radiation to cure said radiation curable binder.

13. The process of claim 12, wherein the first material comprises a non-conductive material and the second material comprises a conductive material, and wherein the step of depositing over the second layer comprises the step of depositing a third layer that comprises a third material in a third radiation curable binder, wherein the third material comprises a conductive material and wherein the third layer does not completely cover the second layer.

14. The process of claim 13, wherein the step of depositing over the second layer further comprising the steps of:
   depositing over the second layer where it is not covered by the third layer, a fourth layer that comprises a fourth material in a fourth radiation curable binder, wherein the fourth material comprises a non-conductive material; and
   depositing over the third and fourth layers a fifth layer that comprises a fifth material in a fifth radiation curable binder, wherein the fifth material comprises a conductive material.

15. The process of claim 14, wherein the second and fifth layer form electrodes, the first and third layer form insulating layers, and the third layer form a via electrically connecting the electrodes separated by the fourth layer.

16. A process of forming a multi-layer electronic component having interconnecting conductive layers, comprising the steps of:
   forming a first conductive layer that comprises a first material;
   forming a via that comprises a second material, over the first conductive layer;
   forming an insulating layer that comprises a third material, around the via; and forming a second conductive layer that comprises a fourth material, whereby at least two of the above forming steps each comprises the step of forming the corresponding layer by radiation curing a slurry that comprises corresponding material for the corresponding layer in a radiation curable binder.

17. The process as in claim 16, comprising the steps of:

forming a first conductive layer by radiation curing a first slurry that comprises a conductive material in a first radiation curable binder;

forming a via by radiation curing a second slurry deposited over the electrode layer, which comprises a conductive material in a second radiation curable binder;

forming an insulating layer around the via by radiation curing a third slurry that comprises a non-conductive material; and forming a second conductive layer by radiation curing a third slurry that comprises a conductive material in a third radiation curable binder.

18. The process of claim 16, further comprising the step of firing or sintering the layers formed.

19. A multi-layer electronic component, formed in accordance with the process of claim 1.

20. A multi-layer electronic component, formed in accordance with the process of claim 16.

21. The multi-layer electronic component as in claim 20, wherein the component is a part of a larger electronic component.

22. A process of forming a multi-layer electronic component on a substrate, comprising the steps of:

depositing over the substrate a first layer that comprises a first material, in a first curable binder;

curing the first curable binder to form a solid layer;

depositing a second layer that comprises a second material in a second curable binder over the first layer; and curing the second curable binder to form a solid layer.

23. A process of forming a multi-layer electronic component, comprising the steps of:

forming a first layer by curing a layer that comprises a first material in a first curable binder to form a first solid layer; and forming a second layer over the first layer, by curing a layer that comprises a second material in a second curable binder to form a second solid layer.

24. A process of forming a multi-layer electronic component, comprising the steps of:

forming a base structure;

forming a first conductive structure over the base structure, the first conductive structure being formed by depositing a first layer of a first conductive material in a first curable binder in a manner that does not completely cover the base structure and curing said first layer in its entirety;

forming a non-conductive structure over the base structure, by depositing a layer of a non-conductive material in a second curable binder over the base structure where it is not covered by the first conductive structure and curing said second curable binder; and forming a second conductive structure over the non-conductive layer, wherein the second conductive structure and the base structure are conductively coupled via the first conductive structure.

* * * * *